United States Patent [19]
Suga

[11] Patent Number: 5,935,642
[45] Date of Patent: Aug. 10, 1999

[54] FORMATION OF RESISTOR WITH SMALL OCCUPIED AREA

[75] Inventor: Shigeru Suga, Hamamatsu, Japan

[73] Assignee: Yamaha Corporation, Japan

[21] Appl. No.: 08/752,393

[22] Filed: Nov. 20, 1996

[30] Foreign Application Priority Data

Nov. 24, 1995  [JP]  Japan .................................... 7-329731

[51] Int. Cl.[6] .................................................. B05D 5/12
[52] U.S. Cl. ............................ 427/101; 427/102; 427/103; 29/610.1; 29/620
[58] Field of Search .............................. 427/97, 101, 102, 427/103; 29/610.1–620; 257/359, 380, 381, 385

[56] References Cited

U.S. PATENT DOCUMENTS

| | | | |
|---|---|---|---|
| 4,541,166 | 9/1985 | Yamazaki | 257/380 |
| 4,702,937 | 10/1987 | Yamoto et al. | 427/102 |
| 4,812,419 | 3/1989 | Lee et al. | 427/102 |
| 5,422,298 | 6/1995 | Jimenez . | |
| 5,567,977 | 10/1996 | Jimenez . | |

*Primary Examiner*—Brian K. Talbot
*Attorney, Agent, or Firm*—Ostrolenk, Faber, Gerb & Soffen, LLP

[57] ABSTRACT

Resistor material such as polysilicon is deposited on the insulating surface of a substrate and patterned to form resistor layers disposed generally parallel. Another resistor material such as polysilicon is deposited filling each space between adjacent resistor layers, with an insulating film being interposed between the upper and lower resistor materials, and etched back to form other resistor layers at respective spaces. After an insulating film is formed covering the resistor layers, contact holes are formed in the insulating film. A conductive layer is deposited and patterned to serially connect the resistor layers.

15 Claims, 10 Drawing Sheets

FORMATION OF RESISTOR WITH SMALL OCCUPIED AREA

BACKGROUND OF THE INVENTION a) Field of the Invention

The present invention relates to a resistor forming method suitable for manufacture of LSI and the like, and more particularly to techniques of forming a resistor with a small occupied area and a high precision.

b) Description of the Related Art

Polysilicon resistors of a folded pattern, stripe pattern, and the like are widely used in an analog IC, analog/digital IC, and the like.

The width of a polysilicon resistor layer is required to be narrow in order to reduce an area occupied by the resistor. It is not easy to make a narrow polysilicon layer. As a polysilicon layer is made narrow, a precision of the width lowers and variations of resistance values become large.

A polysilicon resistor of a folded pattern, stripe pattern, and the like has a number of serially connected polysilicon layers of a bar shape. Each space between bar-shaped polysilicon layers is not used for forming the resistor and the area occupied by the resistor becomes large.

SUMMARY OF THE INVENTION

It is an object of the present invention to provide a novel resistor forming method capable of reducing an area occupied by a resistor and improving a precision of resistor forming processes.

According to one aspect of the present invention, there is provided a resistor forming method comprising the steps of: depositing first resistor material on an insulating surface of a substrate and patterning the first resistor material to form N first resistor layers made of the first resistor material, with spaces being interposed between the first resistor layers, wherein N is an arbitrary integer of 2 or larger; forming first and second insulating films on side walls of adjacent two resistor layers among the N first resistor layers; depositing second resistor material to a thickness greater than a depth of each space between the first resistor layers, the second resistor material covering the first and second insulating films and the N first resistor layers, removing the second resistor material in a planarized manner to form (N–1) second resistor layers made of the second resistor material at respective ones of the spaces, each of the (N–1) second resistor layers being electrically separated from adjacent ones of the first resistor layers by the first and second insulating films; and serially connecting the N first resistor layers and the (N–1) second resistor layers by conductive material to form a resistor.

The (N–1) second resistor layers are formed filling (N–1) spaces between the N first resistor layers. A resistor is formed by serially connecting the first and second resistor layers. The area occupied by the resistor is reduced correspondingly to the area of spaces used for the second resistor layers.

The width of each of the second resistor layer is determined in a self-alignment manner by the width of each space between the first resistor layers. A process error of the first resistor layer in the width direction is cancelled by a process error of the space, with respect to determination of the resistance value. A resistor of high precision can therefore be formed.

DETAILED DESCRIPTION OF THE PREFERRED EMBODIMENTS

FIGS. 1 to 11 illustrate a resistor forming method according to an embodiment of the invention.

Figure 1:
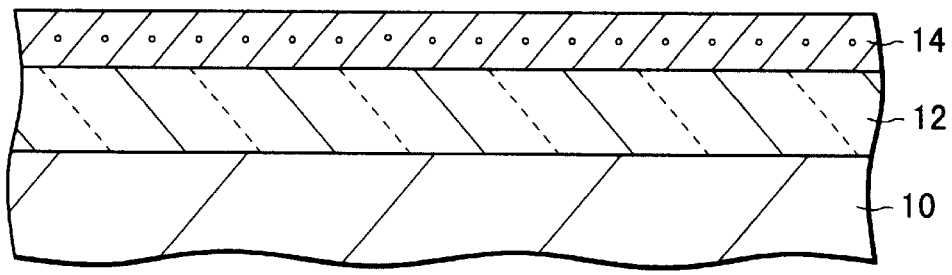
FIG. 1 is a cross sectional view of a substrate illustrating a polysilicon deposition process of a resistor forming method according to an embodiment of the invention.

At the process illustrated in FIG. 1, a polysilicon layer 14 is formed on an insulating film 12 such as silicon oxide covering the surface of a semiconductor substrate 10 made of silicon or the like. For example, the polysilicon layer 14 is formed to a thickness of 300 nm by lower pressure chemical vapor deposition (CVD). The deposition conditions are, for example, a pressure of 200 mTorr, source gas of $SiH_4+N_2$, and a substrate temperature of 600° C. Thereafter, phosphorous ions are implanted into the polysilicon layer 14 to adjust the resistivity thereof. Impurities may be boron, arsenic, or the like. Instead of ion implantation, diffusion may be used. The impurity concentration of the polysilicon layer 14 is, for example, $10^{20}$ cm$^{-3}$.

Figure 2:
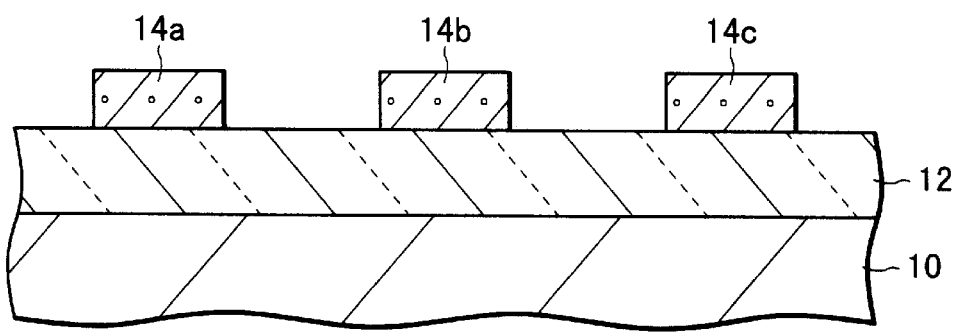
FIG. 2 is a cross sectional view of the substrate illustrating a patterning process after the process of FIG. 1.

Next, at the process illustrated in FIG. 2, the polysilicon layer 14 is patterned by known photolithography and selective dry etching to form bar-shaped resistor layers 14a, 14b, and 14c of polysilicon extending in the depth direction (in the direction perpendicular to the drawing sheet in FIG. 2). The resistor layers 14a to 14c are juxtaposed generally parallel, with spaces of a predetermined width being interposed therebetween. Dry etching is performed by using Cl-containing etching gas such as BCl$_3$ and Cl$_2$.

Figure 3:
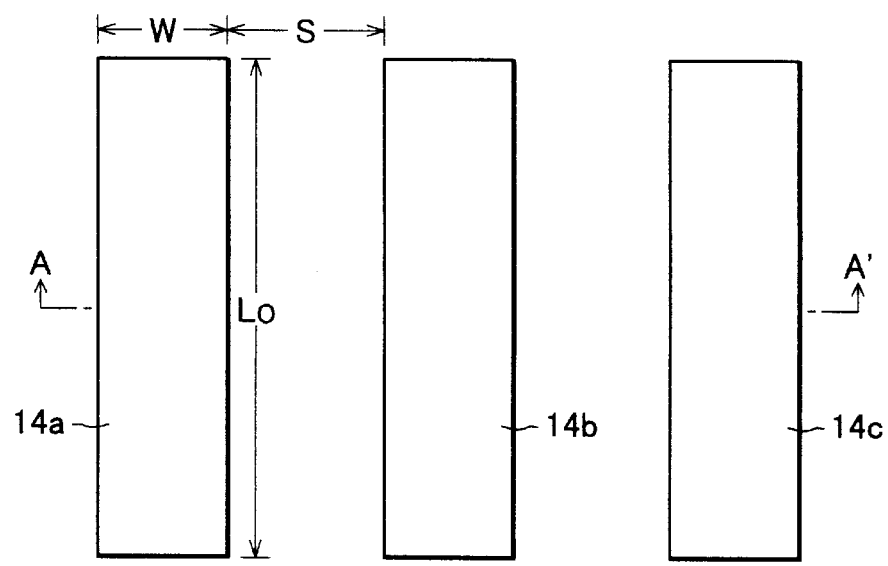
FIG. 3 is a plan view showing a layout of patterned resistor layers shown in FIG. 2.

FIG. 3 shows a plan pattern of the resistor layers 14a to 14c, the cross sectional view taken along line A-A' corresponding to FIG. 2. The width W and length L$_o$ of each resistor layer 14a to 14c and the space width S between the resistor layers are, for example, W=0.5 µm, L$_o$=50 µm, and S=0.56 µm. The width W, and space width S have preferably an allowable size error of ±20% or smaller. The length L$_o$ has preferably an allowable size error of 1 µm or smaller for 50 µm length.

Figure 4:
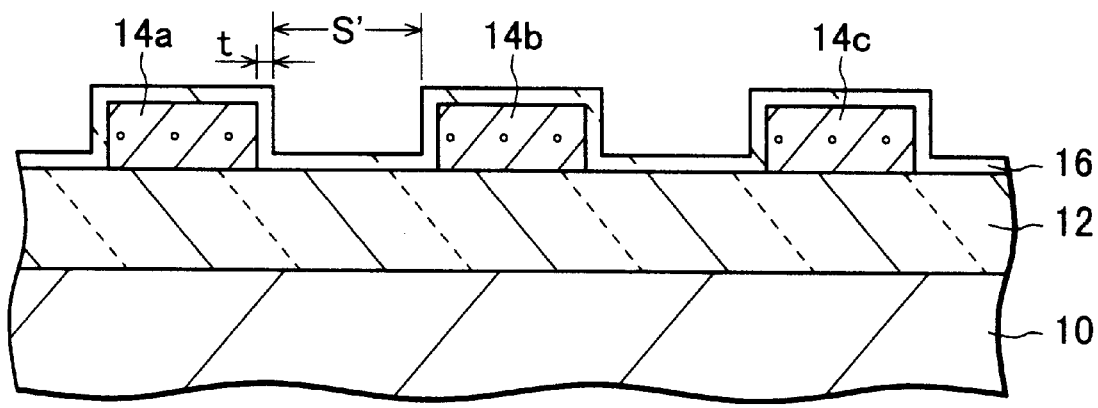
FIG. 4 is a cross sectional view of the substrate illustrating an insulating film forming process after the process of FIG. 2.

Next, at the process illustrated in FIG. 4, an insulating film 16 is formed covering the insulating film 12 and resistor layers 14a to 14c to electrically isolate each resistor layer 14a to 14c. For example, a silicon oxide film is formed as the insulating film 16 to a thickness of 30 nm by lower pressure CVD (source gas: TEOS, substrate temperature: 710° C.). The insulating film 16 may be a silicon nitride film or the like. Instead of a deposition film, the surface of the polysilicon layers 14a to 14c may be oxidized/nitrified to form an insulating film. In this case, the insulating film 16 covers only the surface of the polysilicon layers 14a to 14c. The thickness of the insulating film 16 is preferably 100 nm or thinner, or more preferably 50 nm or thinner.

As the insulating film 16 is formed, the space width between the resistor layers 14a and 14b and resistor layers 14b and 14c is reduced from S (FIG. 3) to S' (FIG. 4). This space width S' is given by the following equation (1) where t is a thickness of the insulating film 16 formed on the side wall of the resistor layers 14a to 14c. The thickness t of the insulating film 16 formed conformal to the underlying layer by low pressure CVD can be controlled precisely and has generally the same thickness on the upper surface and side wall of the resistor layers 14a to 14c.

$$S'=S-2t \quad (1)$$

In order to suppress a change in the resistance value by a process error of the width W of each resistor layer 14, the width W and space S are designed to satisfy the following equations (2a) and (2b).

$$W=S'=S-2t \quad (2a)$$

$$S=W+2t \quad (2b)$$

Figure 5:
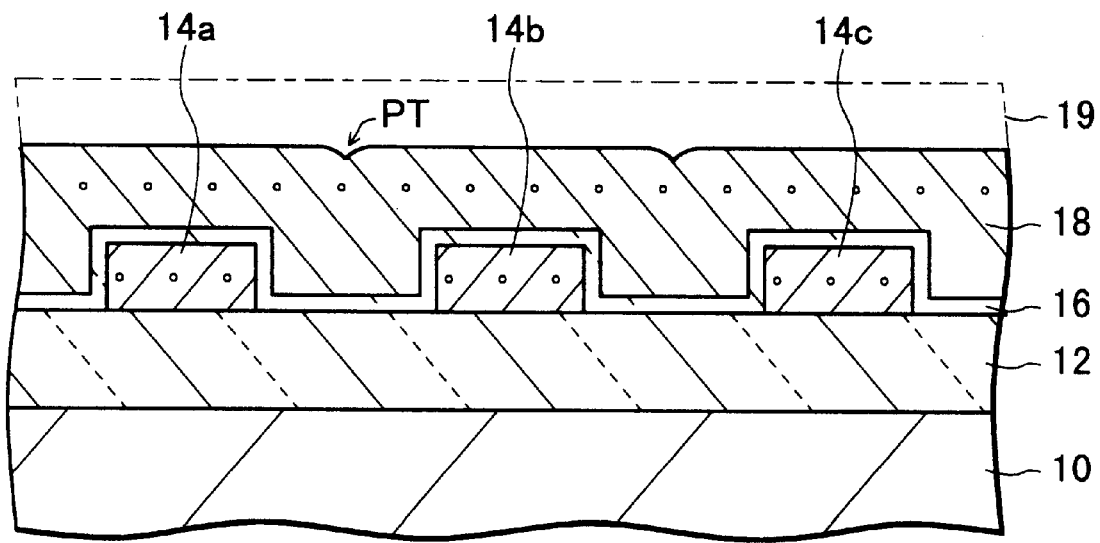
FIG. 5 is a cross sectional view of the substrate illustrating a polysilicon deposition process after the process of FIG. 4.

Next, at the process illustrated in FIG. 5, a polysilicon layer 18 is formed covering the insulating film 16. For example, the polysilicon layer 18 is formed to a thickness of 300 nm in the same manner as the polysilicon layer 14. The thickness of the polysilicon layer 18 is shown in FIG. 5 in the scale different from that of the polysilicon layer 14. The space width S' is 500 nm. Therefore, the polysilicon layer 18 of 300 nm thick deposited conformal to the underlying layer completely fills the space. The thickness of the polysilicon layer 18 is preferably thicker than a half of the space width S' so that the polysilicon layer 18 completely fills the space and the surface of the polysilicon layer 18 is planarized as much as possible. Similar to the polysilicon layer 14, impurities such as phosphorous are doped to adjust the resistivity of the polysilicon layer 18. With this impurity doping, the resistivity of the polysilicon layer 18 is made generally equal to that of the polysilicon layer 14.

Figure 6:
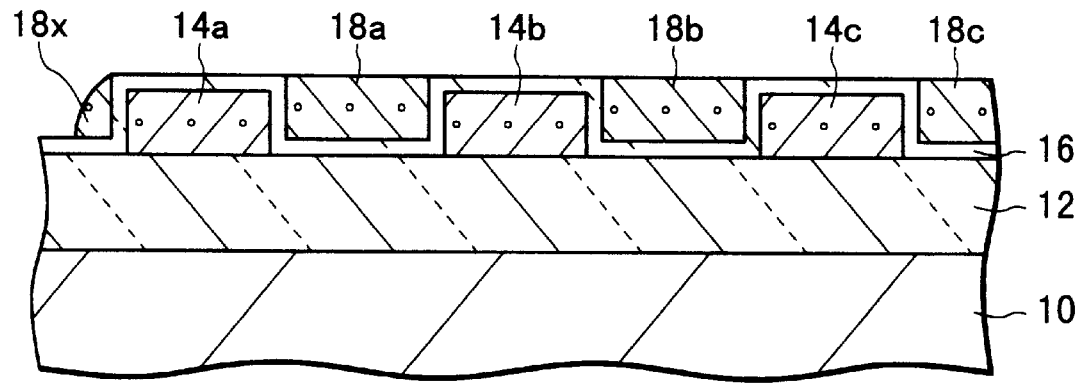
FIG. 6 is a cross sectional view of the substrate illustrating an etch-back process after the process of FIG. 5.

At the process illustrated in FIG. 6, the polysilicon layer 18 is etched back until the surface of the insulating film 16 on the resistor layers 14a to 14c is exposed. For example, this etch-back is performed by anisotropic dry etching using Cl$_2$-containing etching gas. Bar-shaped resistor layers 18a to 18c of polysilicon are left in the spaces between the resistor layers 14a to 14c. The length L$_o$ of the resistor layers 18a to 18c in the depth direction is set to generally the same length of the resistor layers 14a to 14c.

If a pit PT such as shown in FIG. 5 is formed on the surface of the polysilicon layer 18, a pit similar to the pit PT is formed on the surface of the etched-back resistor layers 18a to 18c. These pits may change the resistance value of the resistor layers 18a to 18c. In order to avoid this, after the polysilicon layer 18 is formed at the process of FIG. 5, a planarized layer 19 may be formed by depositing fluid material such as resist and SOG (spin on glass) by spin-coating and planarizing and curing it. The planarized layer 19 and polysilicon layer 18 are thereafter etched back under the conditions that the etching rates for both the layers become generally equal. Generally equal etching rates mean a selection ratio of 1.1 to 0.9. With this process, the thickness of the resistor layers 18a to 18c can be made uniform and the resistance value can be made more precise. Instead of etch-back, chemical mechanical polishing may be used.

Figure 7:
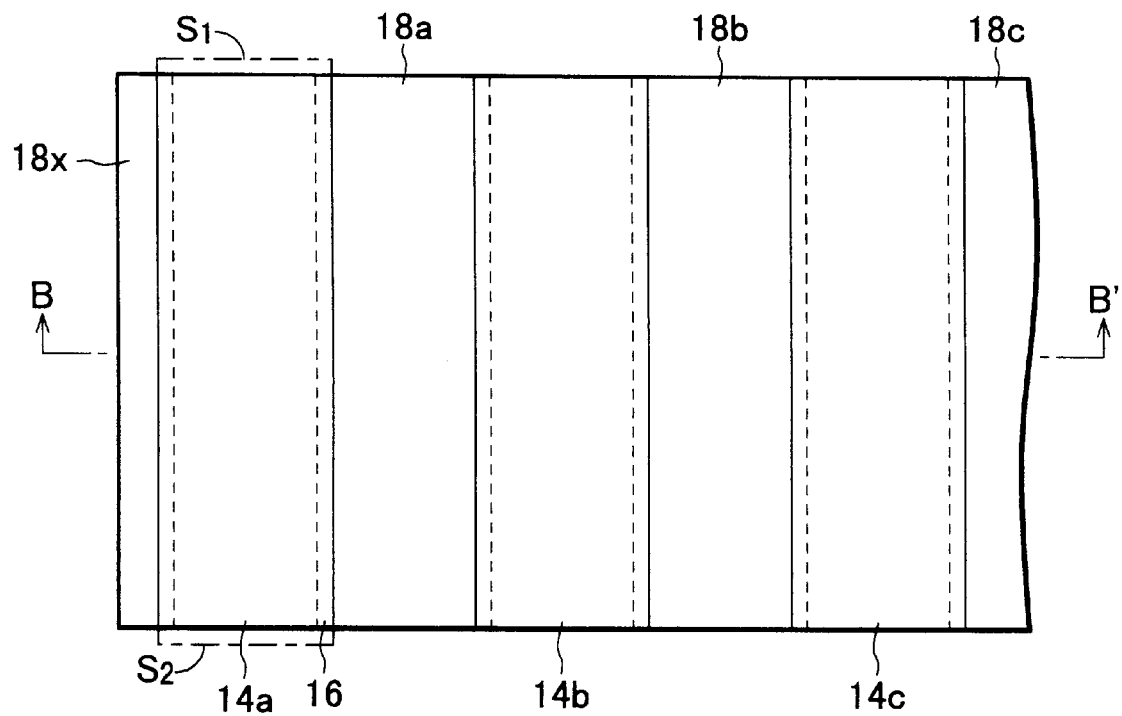
FIG. 7 is a plan view showing a layout of etched back resistor layers shown in FIG. 6.

FIG. 7 shows a plan pattern of the resistor layers 14a to 14c and 18a to 18c, the cross section taken along line B-B' corresponding to FIG. 6. The opposite end portions of the resistor layer 14a are covered with the insulating films S$_1$ and S$_2$ same as the insulating film 16, such insulating films at the opposite end portions of the resistor layers 14b and 14c are omitted in FIG. 7. A fraction of the polysilicon layer 18 left after the etch-back at the side of the resistor layer 14a is indicated at 18x.

Figure 8:
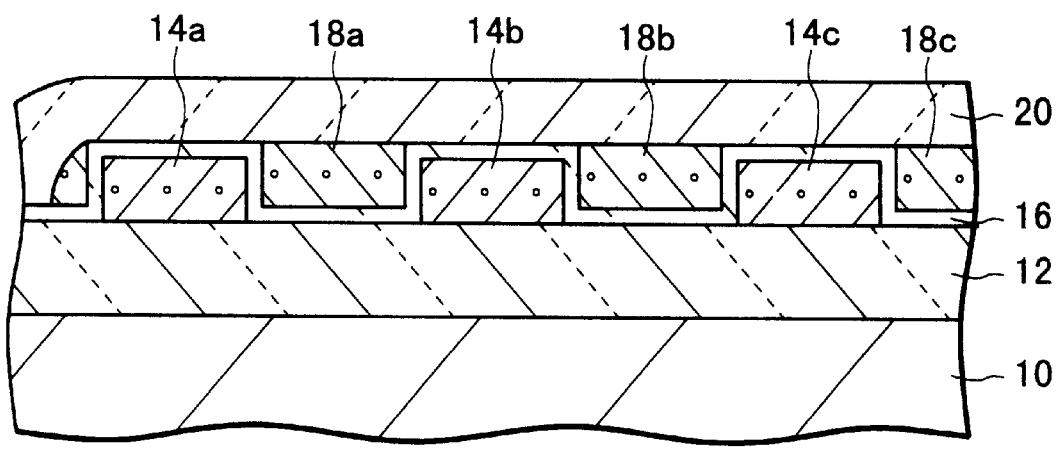
FIG. 8 is a cross sectional view of the substrate illustrating an insulating film forming process after the process of FIG. 6.

Next, at the process illustrated in FIG. 8, an interlayer insulating film 20 is formed covering the insulating film 16 and the resistor layers 18a to 18c. For example, a BPSG (borophosphosilicate glass) film is formed as the insulating film 20 to a thickness of 500 nm by atmospheric pressure CVD (source gas: SiH$_4$+O$_2$+PH$_3$+B$_2$H$_6$, substrate temperature: 450° C.). A PSG (phosphosilicate glass) film, a silicon oxide film, or the like may be used as the insulating film 20.

Figure 9:
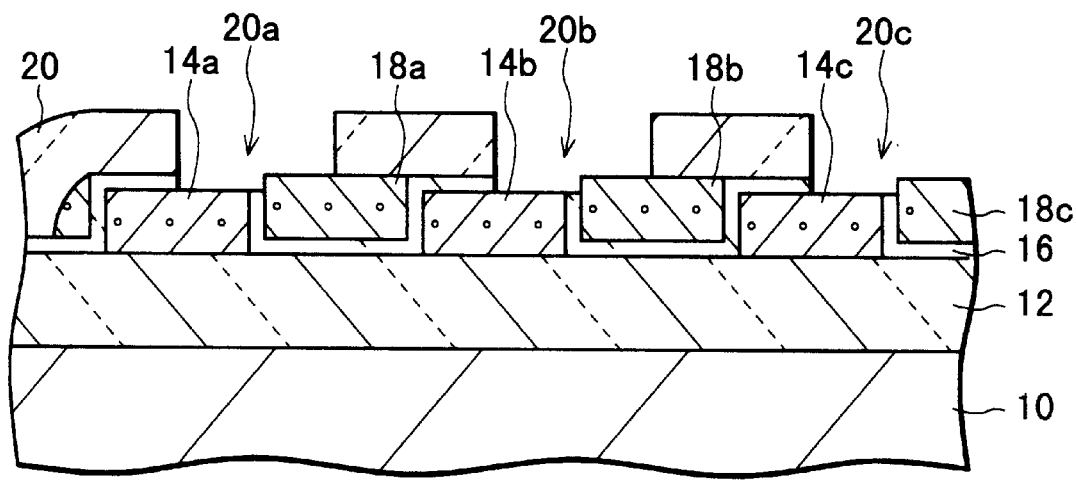
FIG. 9 is a cross sectional view of the substrate illustrating a contact hole forming process after the process of FIG. 8.

At the process illustrated in FIG. 9, contact holes 20a to 20c are formed in the insulating film 20 by photolithography and selective dry etching of the insulating films 16 and 20. Parts of the resistor layers, such as 14a and 18b, are exposed from the contact hole. The contact holes 20a to 20c are used for electrical contact between adjacent resistor layers 14a and 18a, 14b and 18b, and 14c and 18c, and are formed through the insulating film 16 at the areas on the resistor layers 14a to 14c. For dry etching, CHF$_3$-containing etching gas is used.

Figure 10:
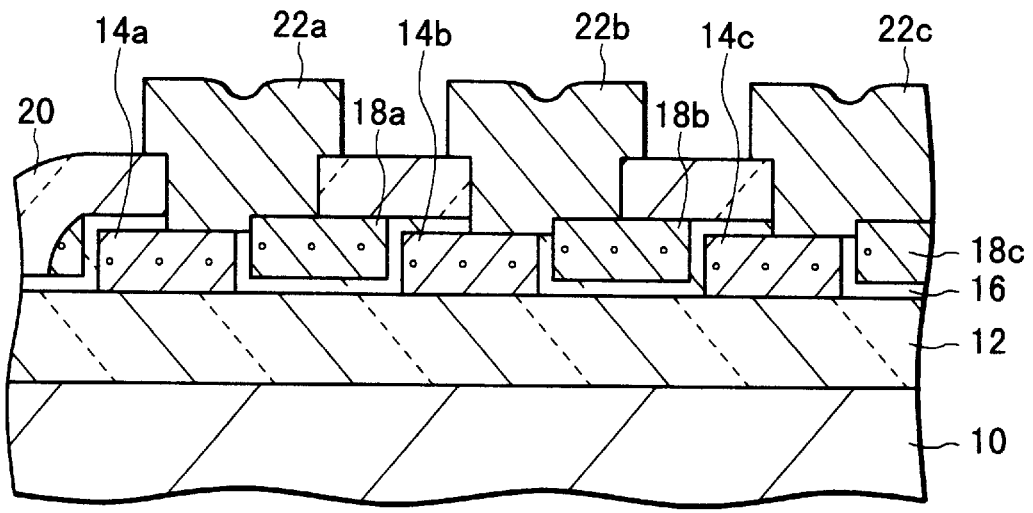
FIG. 10 is a cross sectional view of the substrate illustrating a conductive layer forming process after the process of FIG. 9.

Next, at the process illustrated in FIG. 10, conductive material is deposited covering the insulating film 20 and contact holes 20a to 20c. For example, aluminum alloy (Al—Si—Cu) is sputtered as the conductive material to a thickness of 1° C. Sputter conditions may be a sputtering chamber atmosphere of Ar gas (2 mTorr), RF power of 9 kW, and substrate temperature of 200° C.).

Thereafter, the sputtered conductive material layer is patterned by photolithography and selective dry etching to form conductive layers 22a to 22c in the contact holes 20a to 20c to electrically connect the resistor layers 14a and 18a; 18a and 14b; 14b and 18b, respectively. For dry etching, Cl-containing gas such as BCl$_3$ and Cl$_2$ is used.

Figure 11:
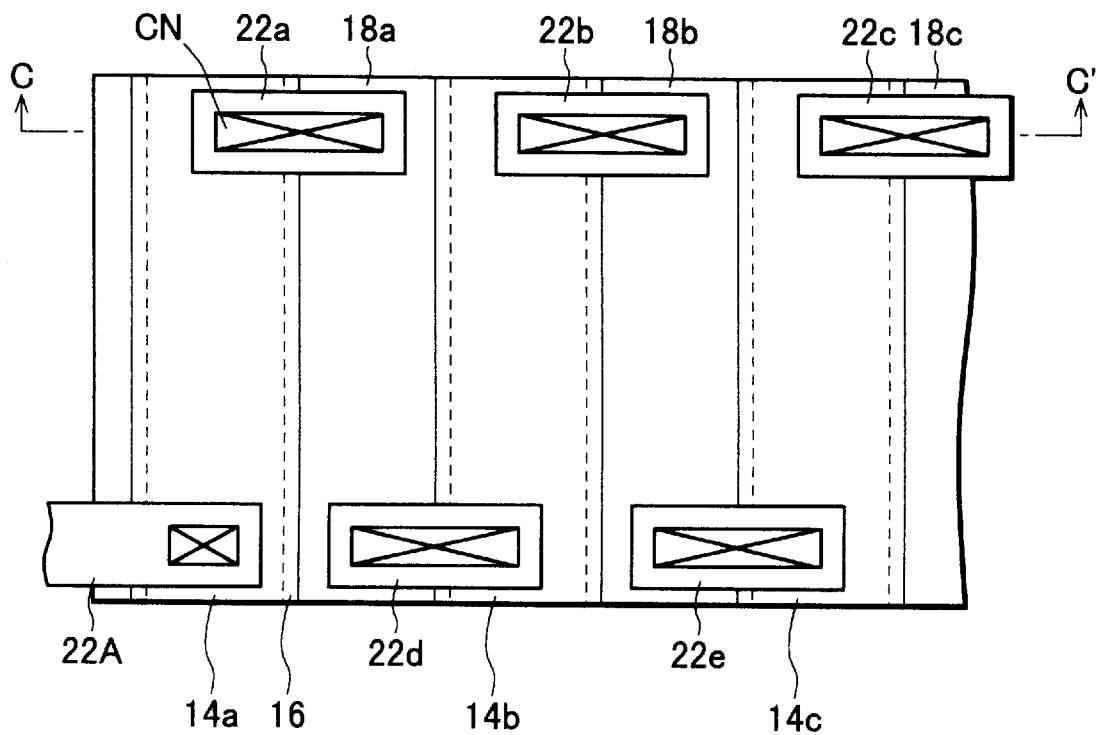
FIG. 11 is a plan view showing a layout of resistor layers and conductive layers after the process of FIG. 10.

FIG. 11 shows a plan pattern of the resistor layers 14a to 14c, and 18a to 18c and the conductive layers 22A, 22a to 22e, the cross sectional view taken along line C-C' corresponding to FIG. 10. In FIG. 11, CN represents a contact area at a contact hole 20a or the like. The conductive layers 22A, 22d, and 22e are conductive layers formed at the same time when the conductive layers 22a to 22c are formed.

The resistor layer 18a is serially connected at its one end portion to the resistor layer 14a by the conductive layer 22a, and at its other end portion to the resistor layer 14b by the conductive layer 22d. The resistor layer 18b is serially connected at its one end portion to the resistor layer 14b by the conductive layer 22b, and at its other end portion to the resistor layer 14c by the conductive layer 22e. The resistor layer 18c is also serially connected to the resistor layers at its both sides. A resistor having a desired resistance value is therefore formed by serially connecting a plurality of resistor layers.

Figure 12:
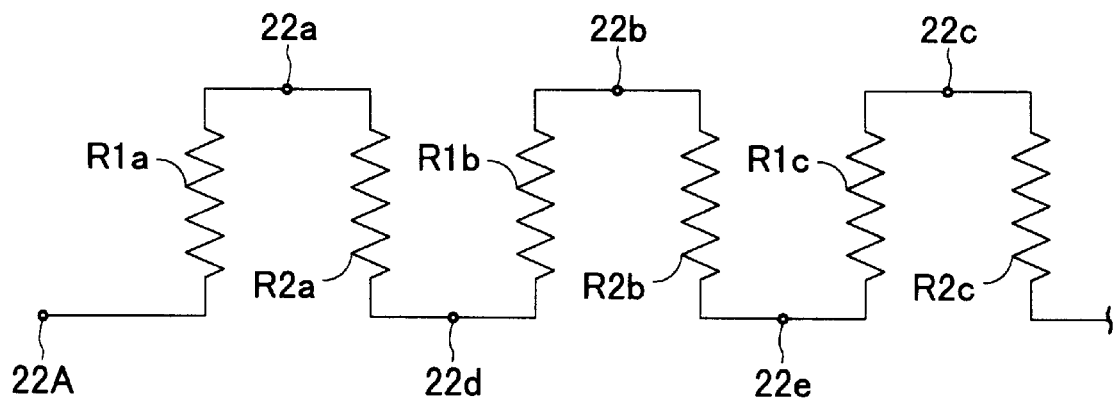
FIG. 12 is an equivalent circuit of the resistor shown in FIG. 11.

FIG. 12 is an equivalent circuit of the resistor shown in FIG. 11. R1a to R1c represent the resistance components of the respective resistor layers 14a to 14c, and R2a to R2c represent the resistance components of the respective resistor layers 18a to 18c. The conductive layer 22A is one terminal of the resistor shown in FIG. 11, the other terminal being omitted in FIG. 11.

With the resistor forming method described above, another resistor layer is disposed at the space between other adjacent resistor layers so that the area occupied by resistors can be generally reduced to a half of a conventional resistor. Furthermore, since another resistor layer is formed in a self-alignment manner at the space between other adjacent resistor layers, a precision of resistor forming processes can be improved.

Consider for example that a resistance value R is obtained by serially connecting N resistor layers. A resistance value R' obtained by a conventional method is given by the following formula (3), where W represents a width of each resistor layer, α represents a process error of the width W, $R_s$ represents a sheet resistance of each resistor layer, and L represents a length of each resistor layer between contact points.

$$\begin{aligned} R' &= N \times R_s \times L/(W + \alpha) \\ &= N \times R_s \times (L/W) \times (1/(1 + \alpha/W)) \\ &\simeq N \times R_s \times (L/W) \times (1 - \alpha/W) \\ &= R \times (1 - \alpha/W) \end{aligned} \quad (3)$$

$R = N \times R_s \times (L/W)$ represents a target resistance value.

A resistance value R" obtained by the embodiment method of the invention is given by the following formula (4).

$$\begin{aligned} R' &= (N/2) \times R_s \times L/(W + \alpha) + (N/2) \times R_s \times L/(W - \alpha) \\ &= (N/2) \times R_s \times (L/W) \times \{1/(1 + \alpha/W) + 1/(1 - \alpha/W)\} \\ &= (R/2) \times 2/[1 - (\alpha/W)^2] \\ &\simeq R \times [1 + (\alpha/W)^2] \end{aligned} \quad (4)$$

It can be seen from the comparison between the formulas (3) and (4) that the first order errors are cancelled out and the resistance value R" obtained by the embodiment method of this invention has a smaller error (the second order error) of the target value R as compared to the resistance value R' obtained by the conventional method.

In the above embodiment, impurities are doped after each of the polysilicon layers 14 and 18 is formed to adjust the resistivities of the polysilicon layers. Another impurity doping process usable as an alternative is illustrated in FIG. 13.

Figure 13:
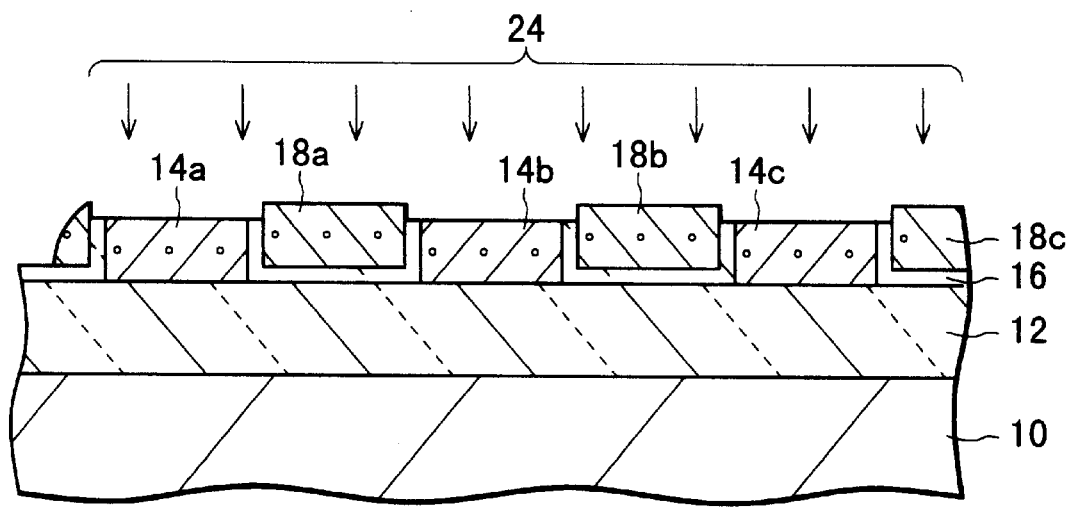
FIG. 13 is a cross sectional view of a substrate illustrating an impurity doping process according to a modification of the embodiment.

At the process illustrated in FIG. 13, after the etch-back process of FIG. 6, the insulating film 16 left on the resistor layers 14a to 14c is etched to expose the upper surfaces of the resistor layers 14a to 14c. Resistivity adjusting impurities 24 are doped into the resistor layers 14a to 14c and 18a to 18c under generally the same doping conditions.

With the impurity doping process of FIG. 13, only a single impurity doping process is used. As compared to impurity doping separately for each polysilicon layer, it is easy to make the impurity concentrations (resistivities) in the resistor layers 14a to 14c and 18a to 18c equal to each other. A precision of resistance value can therefore be further improved.

Figure 14:
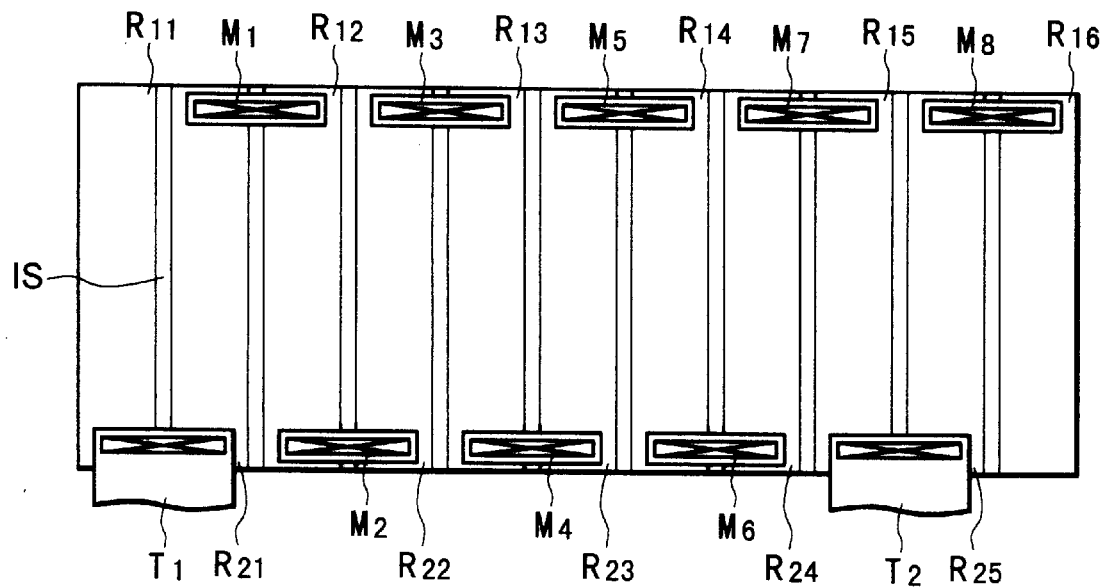
FIG. 14 is a plan view showing a resistor according to another embodiment of the invention.

FIG. 14 shows a resistor according to another embodiment of the invention. The feature of this resistor resides in that resistor layers not used are formed on both sides of the resistor so that the numbers of two series of serial resistor layers are made equal.

In the resistor shown in FIG. 14, resistor layers $R_{11}$ to $R_{16}$ are formed by the same method as the resistor layers 14a to 14c, and resistor layers $R_{21}$ to $R_{25}$ are formed by the same method as the resistor layers 18a to 18c. IS represents an insulating film like the insulating film 16. The resistor layers $R_{11}$ to $R_{16}$ and $R_{21}$ to $R_{25}$ are serially connected by conductive layers $T_1$, $M_1$ to $M_7$, $T_2$, and $M_8$ in the similar manner to FIG. 11. The conductive layers $T_1$ and $T_2$ are opposite terminals of the resistor constituted by the serially connected resistor layers $R_{12}$ to $R_{15}$ and $R_{21}$ to $R_{24}$.

In this resistor structure, the outermost two resistor layers $R_{11}$ and $R_{16}$ among the resistor layers $R_{11}$ to $R_{16}$ and the outer most resistor layer $R_{25}$ among the resistor layers $R_{21}$ to $R_{25}$ are not used as the resistor element.

The reason of not using the resistor layers $R_{11}$ and $R_{16}$ is as follows. If the polysilicon layer is dry-etched by using a dense bar pattern mask, the etching rate at the outermost two bar pattern mask becomes faster than that at the inner dense bar pattern mask, and a process precision is lowered. A precision of resistor forming processes can be improved by not using the resistor layers to be formed at a low process precision.

The reason of not using the resistor layer $R_{25}$ is that four resistor layers $R_{21}$ to $R_{24}$ are made to be serially connected to the same number of resistor layers $R_{12}$ to $R_{15}$. The same number of two series of resistor layers are serially connected so that resistance value errors of two series of resistor layers can be cancelled out, and a resistance value precision can be improved. For example, even if the width of the resistor layers $R_{12}$ to $R_{15}$ is narrower than the design width, the width of the resistor layers $R_{21}$ to $R_{24}$ becomes wider correspondingly. Therefore, the resistance value error of the resistance layers $R_{12}$ to $R_{15}$ is cancelled out by the resistance value error of the resistance layers $R_{21}$ to $R_{24}$ when the layers are serially connected, and the resistance value of serially connected resistor layers is hardly affected.

The resistor layer $R_{25}$ is one of the outermost two resistor layers $R_{21}$ and $R_{25}$ among the resistor layers $R_{21}$ to $R_{25}$. Therefore, as compared to not using the central resistor layer (e.g., $R_{23}$), not using the resistor layer $R_{25}$ is preferable because the total length of the connection conductive layers $M_1$ to $M_7$ becomes minimum. Instead of the resistor layer $R_{25}$, the resistor layer $R_{21}$ may be made unusable.

In the resistor shown in FIG. 14, the conductive layers $T_1$ and $T_2$ may be connected only to the resistor layers $R_{21}$ and $R_{15}$, respectively, and the conductive layer $M_8$ may be omitted.

Figure 15:
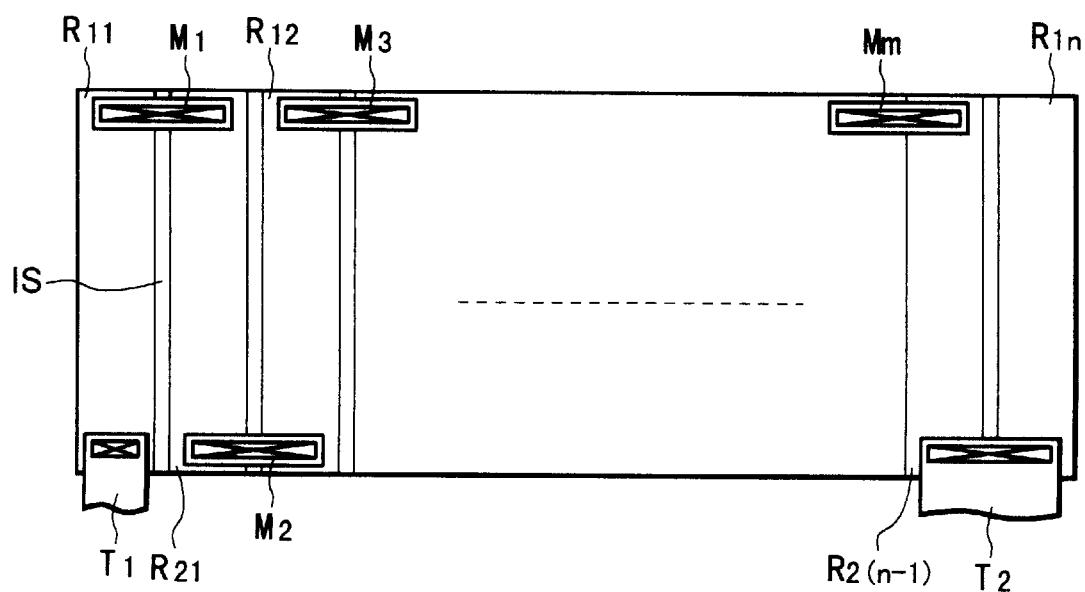
FIG. 15 is a plan view showing a resistor according to a further embodiment of the invention.

FIG. 15 shows a resistor according to a further embodiment of the invention. The feature of this resistor resides in that only one end resistor layer is not used.

In the resistor shown in FIG. 15, resistor layers $R_{11}$ to $R_{1n}$ are formed by the same method as the resistor layers 14a to 14c, and resistor layers $R_{21}$ to $R_{2(n-1)}$ are formed by the same method as the resistor layers 18a to 18c. IS represents an insulating film like the insulating film 16. The resistor layers $R_{11}$ to $R_{1n}$ and $R_{21}$ to $R_{2(n-1)}$ are serially connected by conductive layers $M_1$ to $M_m$ and $T_2$ in the similar manner to FIG. 11. The conductive layers $T_1$ and $T_2$ are opposite terminals of the resistor. The resistor layer $R_{1n}$ is not used as the resistor element. The conductive layer $T_2$ may be connected only to the resistor layer $R_{2(n-1)}$. The number m of the conductive layers $M_1$ to $M_m$ is $2(n-1)-1$ where n is the number of resistor layers $R_{11}$ to $R_{1n}$.

With the resistor structure shown in FIG. 15, the same numbers (n-1) of two series of resistor layers are serially connected so that a precision of resistance value can be improved. Only the outermost one resistor layer $R_{1n}$ among the resistor layers $R_{11}$ to $R_{1n}$ is not used as the resistance element and the outermost one resistor layer $R_{11}$ is used. This structure poses no practical problem if the number (n-1) of resistor layers constituting the resistor is large, because the resistance value of one resistor layer less affects the total resistance value.

Figure 16:
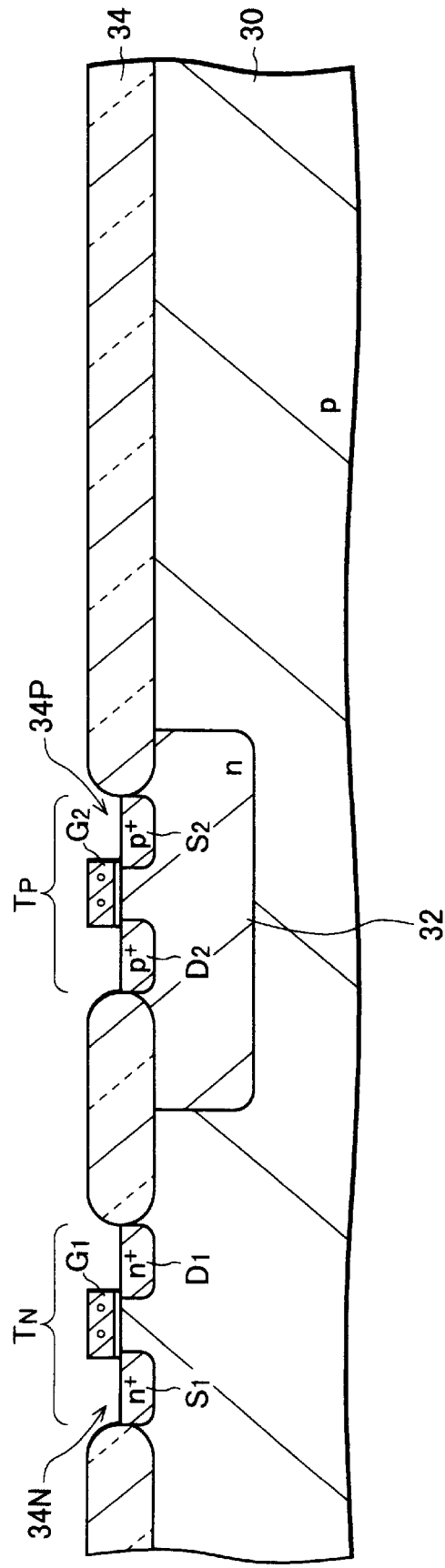
FIG. 16 is a cross sectional view of a substrate illustrating a method of forming CMOS transistors of an IC with a load resistor, according to an embodiment of the invention.
Figure 17:
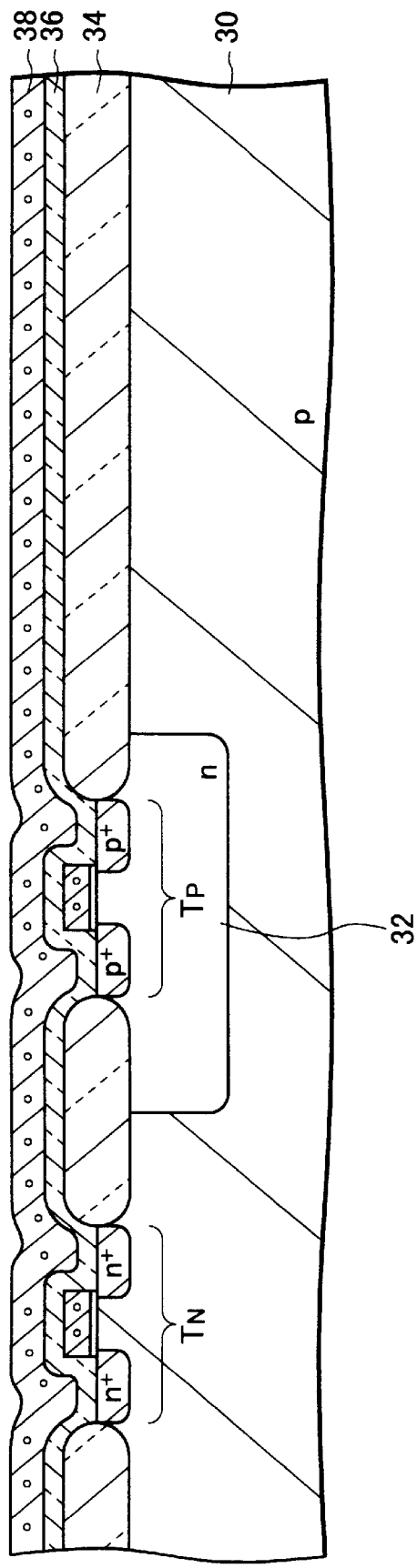
FIG. 17 is a cross sectional view of the substrate illustrating insulating film forming and polysilicon deposition processes after the process of FIG. 16.
Figure 18:
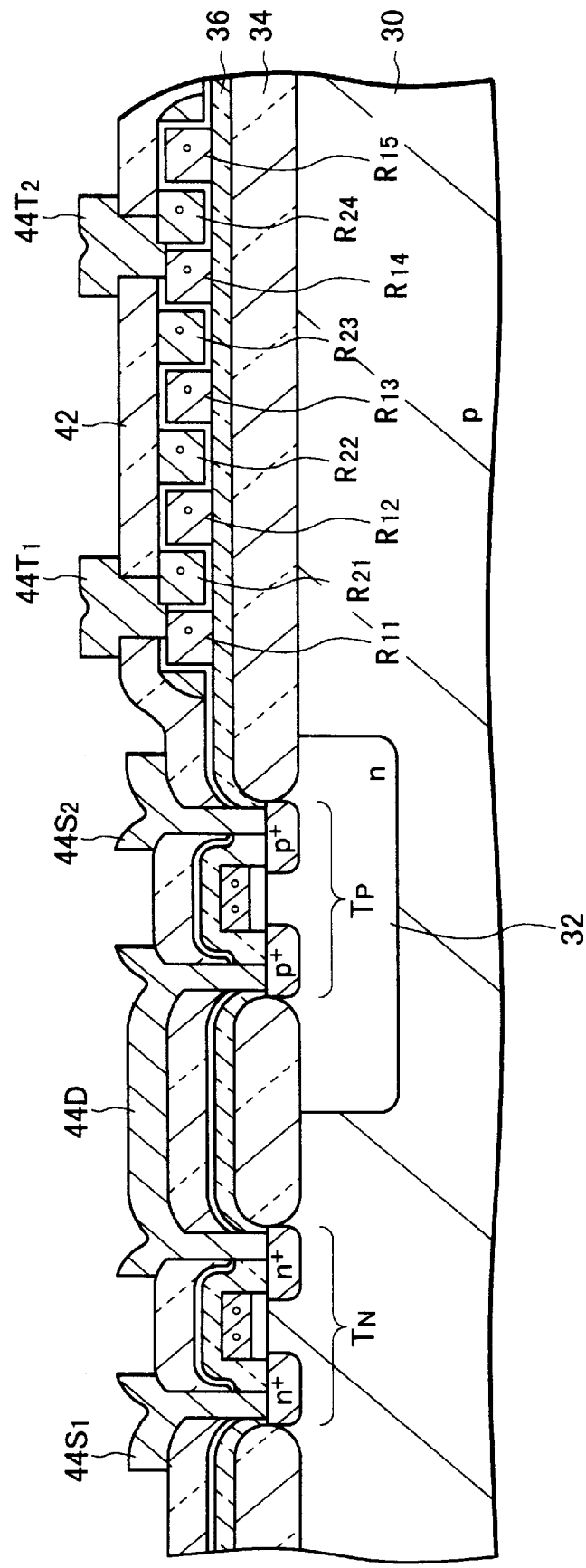
FIG. 18 is a cross sectional view of the substrate illustrating a resistor forming process after the process of FIG. 17.

FIGS. 16 to 18 illustrate a method of forming a resistor on a CMOS IC according to the invention.

At the process illustrated in FIG. 16, on the surface of a semiconductor substrate 30 made of, for example, p-type silicon, an n-type well region 32 and a field insulating film 34 of silicon oxide are formed in know manners. On the p-type semiconductor surface in an active area window 34N of the insulating film 34, an n-channel MOS transistor $T_N$ is formed by silicon gate processes, the transistor $T_N$ having a gate electrode layer $G_1$, an $n^+$-type source region $S_1$, and an $n^+$-type drain region $D_1$. Also on the n-type well region surface in an active area window 34P of the insulating film 34, a p-channel MOS transistor $T_P$ is formed by silicon gate processes, the transistor $T_P$ having a gate electrode layer $G_2$, an $p^+$-type source region $S_2$, and an $p^+$-type drain region $D_2$.

Next, at the process illustrated in FIG. 17, an interlayer insulating film 36 is formed to a thickness of 100 to 500 nm by CVD or the like, the film 36 covering the insulating film 34 and transistors $T_N$ and $T_P$. The interlayer insulating film 36 may be a silicon oxide film, a PSG film, a BPSG film, or the like. Thereafter, a polysilicon layer 38 is formed covering the insulating film 36, by CVD.

Next, at the process illustrated in FIG. 18, a resistor is formed in the similar manner described with FIGS. 1 to 11. Specifically, after the resistivity is determined by doping impurities into the polysilicon layer 38, the polysilicon layer 38 is patterned to form resistor layers $R_{11}$ to $R_{15}$ disposed in parallel, with predetermined spaces being interposed therebetween. After an insulating film 40 is formed over the substrate to a thickness of about 20 to 30 nm by CVD or the like, a polysilicon layer is deposited covering the interlayer insulating film 40 and filling the spaces between resistor layers $R_{11}$ to $R_{12}$ and other resistor layers. The deposited polysilicon layer is etched back to form resistor layers $R_{21}$ to $R_{24}$.

Thereafter, an interlayer insulating film 42 is formed over the substrate by CVD or the like. Contact holes are formed in the insulating films 36, 40, 42, and the like by photolithography and selective dry etching, the contact holes being used for electrical connection between circuit elements such as transistors and resistors. Conductive material such as Al alloy is deposited and patterned to form source wiring conductive layers $44S_1$ and $44S_2$, a drain wiring conductive layer 44D, resistor wiring conductive layers $44T_1$ and $44T_2$, and the like. At this time, conductive layers serially connecting the resistor layers $R_{21}$, $R_{12}$, $R_{22}$, $R_{13}$, $R_{23}$, and $R_{14}$ are also formed similar to the process shown in FIG. 14, these conductive layers being omitted in FIG. 18. In the example shown in FIG. 18, the connection method of FIG. 14 is adopted so that the resistor layers $R_{11}$, $R_{15}$, and $R_{24}$ are not used.

The invention is not limited to the above embodiments, but various modifications are possible. For example, the following modifications are possible.

(1) The resistor layer is not limited to polysilicon, but other resistive materials such as high resistivity metals may be used.

(2) Impurity doping into the polysilicon layer 14 or 18 may be performed during depositing polysilicon.

(3) The insulating film 16 may be formed by thermally oxidizing the surface of the polysilicon layer, instead of forming it by vapor deposition.

(4) The insulating film 16 is sufficient if only it covers at least the side walls of adjacent resistor layers. Therefore, prior to depositing the polysilicon layer 15 at the process of FIG. 5, the insulating film 16 on the upper surfaces of the resistor layers 14a to 14c and the bottom surface of the spaces of width S' may be removed by anisotropic etching or the like. In this case, the resistor layers 14a to 14c and the resistor layers 18a to 18c are flush with the common plane (upper surface of the insulating film 12).

(5) In removing the resistive material deposition layer in a planarized manner, CMP (chemical mechanical polishing) may be used instead of etch-back.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A resistor forming method comprising the steps of:

depositing first resistor material on an insulating surface of a substrate and patterning said first resistor material to form N first resistor layers made of said first resistor material, with spaces being interposed between said first resistor layers, wherein N is an arbitrary integer of 2 or larger;

forming a first insulating film on side walls adjacent two resistor layers among said N first resistor layers;

depositing second resistor material to a thickness greater than a depth of each space between said first resistor layers, said second resistor material covering said first insulating film and said N first resistor layers, removing said second resistor material in a planarized manner to form (N-1) second resistor layers made of said second resistor material at respective ones of said spaces, each of said (N-1) second resistor layers being electrically separated from adjacent ones of said first resistor layers by said first and second insulating films;

forming an insulating layer over the first and second resistor layers;

forming holes in the insulating layer, wherein each of the holes exposes a part of the first and second resistor layers; and electrically connecting the N first resistor layers and the (N-1) second resistor layers serially by embedding the holes with conductive material to form a resistor.

2. A resistor forming method according to claim 1, wherein said first resistor layer forming step forms said N first resistor layers such that each has substantially the same width and such that each space between adjacent first resistor layers has substantially the same width.

3. A resistor forming method according to claim 1, further comprising the step of forming an external terminal conductive layer on the outermost two resistor layers among said serially connected first and second resistor layers.

4. A resistor forming method according to claim 1, wherein said second resistor layer forming step forms said second resistor layer by etching back said second resistor material in a planarized manner.

5. A resistor forming method according to claim 1, wherein said first insulating film forming step forms said first insulating film by chemical vapor deposition.

6. A resistor forming method comprising the steps of:
 depositing first resistor material on an insulating surface of a substrate and patterning said first resistor material to form N first resistor layers made of said first resistor material, with spaces being interposed between said first resistor layers, wherein N is an arbitrary integer of 2 or larger;
 forming a first insulating film on side walls of adjacent two resistor layers among said N first resistor layers;
 forming a second resistor material layer to a thickness greater than a depth of each space between said first resistor layers, said second resistor material layer covering said first insulating film and said N first resistor layers;
 depositing fluid material covering said second resistor material layer to form a planarized layer for planarizing the surface of said second resistor material layer;
 removing said planarized layer and said second resistor material layer in a planarized manner under the conditions of a substantially equal removing rate in the depth direction so as to leave part of said second resistor material layer in each space between said first resistor layers, to form (N−1) second resistor layers made of said second resistor material layer at respective ones of said spaces, each of said (N−1) second resistor layers being electrically separated from adjacent ones of said first resistor layers by said first insulating film;
 forming an insulating layer over the first and second resistor layers;
 forming holes in the insulating layer, wherein each of the holes exposes a part of the first and second resistor layers; and
 electrically connecting the N first resistor layers and the (N−1) second resistor layers serially by embedding the holes with conductive material to form a resistor.

7. A resistor forming method comprising the steps of:
 depositing first polycrystalline semiconductor on an insulating surface of a substrate and patterning said first resistor material to form N first resistor layers made of said first polycrystalline semiconductor, with spaces being interposed between said first resistor layers, wherein N is an arbitrary integer of 2 or larger;
 forming a first insulating film on side walls of adjacent two resistor layers among said N first resistor layers;
 depositing second polycrystalline semiconductor to a thickness greater than a depth of each space between said first resistor layers, said second polycrystalline semiconductor covering said first insulating film and said N first resistor layers, removing said second polycrystalline semiconductor in a planarized manner to form (N−1) second resistor layers made of said second polycrystalline semiconductor at respective ones of said spaces, each of said (N−1) second resistor layers being electrically separated from adjacent ones of said first resistor layers by said first insulating film;
 after formation of said second resistor layers, adjusting resistivities of said first and second resistor layers by doping resistivity adjusting impurities in said first and second resistor layers;
 after adjusting resistivities of said first and second resistor layers, forming an insulating layer over the first and second resistor layers;
 forming holes in the insulating layer, wherein each of the holes exposes a part of the first and second resistor layers; and
 electrically connecting the N first resistor layers and the (N−1) second resistor layers serially by embedding the holes with conductive material to form a resistor.

8. A resistor forming method comprising the steps of:
 depositing first resistor material on an insulating surface of a substrate and patterning said first resistor material to form N first resistor layers made of said first resistor material, with spaces being interposed between said first resistor layers, wherein N is an arbitrary integer of 3 or larger;
 forming a first insulating film on side walls of adjacent two resistor layers among said N first resistor layers;
 depositing second resistor material to a thickness greater than a depth of each space between said first resistor layers, said second resistor material covering said first insulating film and said N first resistor layers, removing said second resistor material in a planarized manner to form (N−1) second resistor layers made of said second resistor material at respective ones of said spaces, each of said (N−1) second resistor layers being electrically separated from adjacent ones of said first resistor layers by said first and second insulating films;
 forming an insulating layer over the first and second resistor layers;
 forming holes in the insulating layer, wherein each of the holes exposes a part of the first and second resistor layers; and
 electrically connecting the N first resistor layers and the (N−1) second resistor layers serially by embedding the holes with conductive material to form a resistor.

9. A resistor forming method according to claim 8, wherein said electrically connecting step connects (N−2) resistor layers of said N first resistor layers except the outermost two resistor layers on opposite sides and (N−2) resistor layers of said (N−1) second resistor layers except the outermost one resistor layer.

10. A resistor forming method comprising the steps of:
 depositing first polycrystalline semiconductor on an insulating surface of a substrate and patterning said first resistor material to form N first resistor layers made of said first polycrystalline semiconductor, with spaces being interposed between said first resistor layers, wherein N is an arbitrary integer of 2 or larger;
 forming a first insulating film on the surface of said substrate and said first resistor layers;
 depositing second polycrystalline semiconductor to a thickness greater than a depth of each space between said first resistor layers, said second polycrystalline semiconductor covering and said first insulating film and said N first resistor layers;
 removing said second polycrystalline semiconductor in a planarized manner to form (N−1) second resistor layers made of said second polycrystalline semiconductor at respective ones of said spaces, each of said (N−1) second resistor layers being electrically separated from adjacent ones of said first resistor layers by said first insulating film;

removing said first insulating film on said first resistor layers;

after said removing steps, adjusting resistivities of said first and second resistor layers by doping resistivity adjusting impurities into said first and second resistor layers;

forming a second insulating film on said first and second resistor layers;

forming contact holes by removing said second insulating film on said first resistor layers and said second insulating film on said second resistor layers;

forming an insulating layer over the first and second resistor layers;

forming holes in the insulating layer, wherein each of the holes exposes a part of the first and second resistor layers; and electrically connecting the N first resistor layers and the (N−1) second resistor layers serially by embedding the holes with conductive material to form a resistor.

11. A resistor forming method according to claim 1, wherein each of said N first resistor layers and said (N−1) second resistor layers has opposed first and second ends, the respective first ends of said N first resistor layers and (N−1) second resistor layers being located at a first side of said substrate and the respective second ends of said N first resistor layers and said (N−1) second resistor layers being located at a second opposed side of said substrate, and wherein said step of forming holes includes forming a first set of holes, each of which exposes the respective first ends of adjacent N first resistor layers and (N−1) second resistor layers, and a second set of holes, each of which exposes the respective second ends of adjacent N first resistor layers and (N−1) second resistor layers, the first set of holes being in staggered relationship to the second set of holes so that when the holes are embedded with conductive material in said electrical connecting step, said N first resistor layers and said (N−1) second resistor layers are serially connected such as to form a resistor having a zigzag configuration.

12. A resistor forming method according to claim 6, wherein each of said N first resistor layers and said (N−1) second resistor layers has opposed first and second ends, the respective first ends of said N first resistor layers and (N−1) second resistor layers being located at a first side of said substrate and the respective second ends of said N first resistor layers and said (N−1) second resistor layers being located at a second opposed side of said substrate, and wherein said step of forming holes includes forming a first set of holes, each of which exposes the respective first ends of adjacent N first resistor layers and (N−1) second resistor layers, and a second set of holes, each of which exposes the respective second ends of adjacent N first resistor layers and (N−1) second resistor layers, the first set of holes being in staggered relationship to the second set of holes so that when the holes are embedded with conductive material in said electrical connecting step, said N first resistor layers and said (N−1) second resistor layers are serially connected such as to form a resistor having a zigzag configuration.

13. A resistor forming method according to claim 7, wherein each of said N first resistor layers and said (N−1) second resistor layers has opposed first and second ends, the respective first ends of said N first resistor layers and (N−1) second resistor layers being located at a first side of said substrate and the respective second ends of said N first resistor layers and said (N−1) second resistor layers being located at a second opposed side of said substrate, and wherein said step of forming holes includes forming a first set of holes, each of which exposes the respective first ends of adjacent N first resistor layers and (N−1) second resistor layers, and a second set of holes, each of which exposes the respective second ends of adjacent N first resistor layers and (N−1) second resistor layers, the first set of holes being in staggered relationship to the second set of holes so that when the holes are embedded with conductive material in said electrical connecting step, said N first resistor layers and said (N−1) second resistor layers are serially connected such as to form a resistor having a zigzag configuration.

14. A resistor forming method according to claim 8, wherein each of said N first resistor layers and said (N−1) second resistor layers has opposed first and second ends, the respective first ends of said N first resistor layers and (N−1) second resistor layers being located at a first side of said substrate and the respective second ends of said N first resistor layers and said (N−1) second resistor layers being located at a second opposed side of said substrate, and wherein said step of forming holes includes forming a first set of holes, each of which exposes the respective first ends of adjacent N first resistor layers and (N−1) second resistor layers, and a second set of holes, each of which exposes the respective second ends of adjacent N first resistor layers and (N−1) second resistor layers, the first set of holes being in staggered relationship to the second set of holes so that when the holes are embedded with conductive material in said electrical connecting step, said N first resistor layers and said (N−1) second resistor layers are serially connected such as to form a resistor having a zigzag configuration.

15. A resistor forming method according to claim 10, wherein each of said N first resistor layers and said (N−1) second resistor layers has opposed first and second ends, the respective first ends of said N first resistor layers and (N−1) second resistor layers being located at a first side of said substrate and the respective second ends of said N first resistor layers and said (N−1) second resistor layers being located at a second opposed side of said substrate, and wherein said step of forming holes includes forming a first set of holes, each of which exposes the respective first ends of adjacent N first resistor layers and (N−1) second resistor layers, and a second set of holes, each of which exposes the respective second ends of adjacent N first resistor layers and (N−1) second resistor layers, the first set of holes being in staggered relationship to the second set of holes so that when the holes are embedded with conductive material in said electrical connecting step, said N first resistor layers and said (N−1) second resistor layers are serially connected such as to form a resistor having a zigzag configuration.

* * * * *